United States Patent

Han et al.

[11] Patent Number: 5,842,491
[45] Date of Patent: Dec. 1, 1998

[54] SEMICONDUCTOR WAFER CLEANING APPARATUS

[75] Inventors: Suk Bin Han; Yun Jun Huh, both of Chungcheongbuk-do, Rep. of Korea

[73] Assignee: LG Semicon Co., Ltd., Chungcheongbuk-do, Rep. of Korea

[21] Appl. No.: 606,188

[22] Filed: Feb. 23, 1996

[30] Foreign Application Priority Data

Dec. 18, 1995 [KR] Rep. of Korea ................. 51421/1995

[51] Int. Cl.⁶ ..................................... B08B 3/04
[52] U.S. Cl. ...................... 134/44; 134/56 R; 134/57 R; 134/186; 134/902
[58] Field of Search ................................. 134/155, 186, 134/902, 182, 56 R, 57 R, 44

[56] References Cited

U.S. PATENT DOCUMENTS

| 4,899,767 | 2/1990 | McConnell et al. | 134/902 |
| 5,000,207 | 3/1991 | Tittergton et al. | 134/155 |
| 5,159,946 | 11/1992 | Seiichiro | 134/902 |
| 5,292,373 | 3/1994 | Arita et al. | 134/2 |
| 5,485,861 | 1/1996 | Hiratsuka et al. | 134/182 |
| 5,578,193 | 11/1996 | Aoki et al. | 134/902 |

FOREIGN PATENT DOCUMENTS

| 4-43639 | 2/1992 | Japan | 132/902 |
| 4-99025 | 3/1992 | Japan | 134/902 |
| 4-152525 | 5/1992 | Japan | 134/902 |

*Primary Examiner*—Frankie L. Stinson
*Attorney, Agent, or Firm*—Finnegan, Henderson, Farabow, Garrett & Dunner, L.L.P.

[57] ABSTRACT

A semiconductor wafer cleaning apparatus includes an internal cleaning tank having an inlet for introducing and an outlet for removing a cleaning solution, and an external cleaning tank surrounding the internal cleaning tank and having a plurality of inlets and outlets for introducing and removing the cleaning solution. First and second circulation pumps each disposed in the middle of the first and second circulation pipes for connecting the inlet and outlet of the internal cleaning tank with the plurality of inlets and outlets of the external cleaning tank are also provided. A baffle plate may also be disposed within the internal cleaning tank for fixing and separating a cassette having a plurality of wafers contained therein from the bottom of internal cleaning tank. A weight detector is preferably disposed on the baffle plate for detecting a weight heavier than a predetermined reference due to the pressing of the cassette, and a controller for controlling the first and second circulation pumps controls the cleaning operation in response to a detection signal from the weight detector. The semiconductor wafer cleaning apparatus can enhance the cleaning effect by efficiently removing contamination generated during a cleaning process.

23 Claims, 3 Drawing Sheets

F I G.2
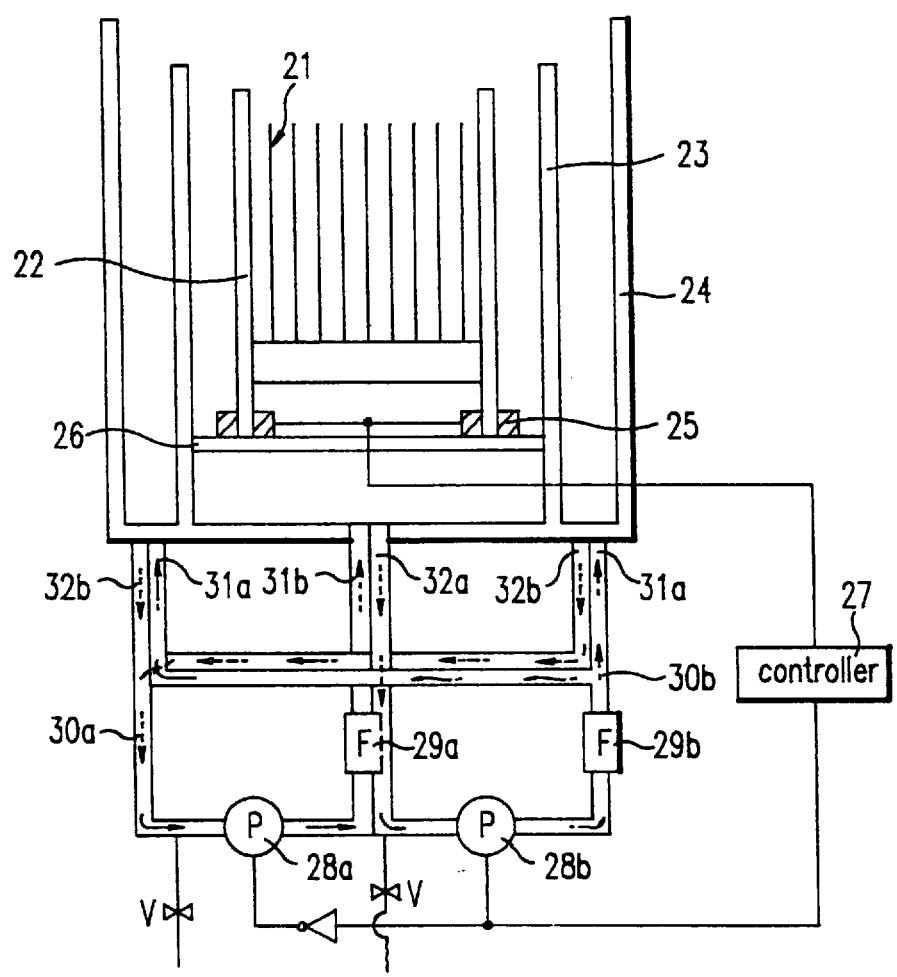

SEMICONDUCTOR WAFER CLEANING APPARATUS

BACKGROUND OF THE INVENTION

The present invention relates to a cleaning apparatus used in manufacturing a semiconductor device, and more particularly, to a semiconductor wafer cleaning apparatus which efficiently removes contamination generated during a cleaning process.

In general, as a semiconductor device becomes more integrated, fine particles remaining on the surface of a wafer tend to increasingly impair the characteristics of the device.

Therefore, wafer cleaning techniques for removing the fine particles contained on the surface of the wafer have become increasingly important in manufacturing semiconductor devices.

Current large scale integrated circuit (LSI) technology is capable of mass producing devices having pattern dimensions of about 2 $\mu$m. A process of making these very fine devices requires an ultra-clean environment, and therefore, requires surface processing and cleaning techniques for maintaining a clean environment.

FIGS. 1a and 1b are schematic diagrams of conventional semiconductor wafer cleaning apparatus.

FIG. 1a illustrates an over-flowing bath system which includes an internal cleaning tank 1 for cleaning wafers 8. The internal cleaning tank 1 has an inlet 3 for introducing a cleaning solution. The inlet 3 is located at the lower central portion of the internal cleaning tank 1. An external cleaning tank 2 surrounds the internal cleaning tank 1 and has an outlet 4 for removing the cleaning solution from the space surrounding the internal cleaning tank 1. A circulation pipe 10 connects inlet 3 with outlet 4, and a circulation pump 5 is disposed in the circulation pipe 10 for circulating the cleaning solution. A filter 6 is also provided for filtering the cleaning solution circulated by circulation pump 5 thereby providing filtered cleaning solution to the internal cleaning tank 1 via inlet 3.

The cleaning operation of the over-flowing bath system having the aforementioned configuration will now be described.

First, the cleaning solution is driven by the circulation pump 5 to pass through the filter 6 and into the internal cleaning tank 1 via inlet 3.

Then, wafers 8 are fixed in a cassette 7 and dipped into the cleaning solution.

At this time, fine particles existing on the surface of wafers 8 are cleaned by the circulating cleaning solution flowing through the spaces between the wafers 8.

In other words, the wafers 8 react chemically with and are also mechanically cleaned by the cleaning solution, producing a simultaneous cleaning and etching action.

FIG. 1b illustrates a down-flowing bath system, which includes an internal cleaning tank 1 for cleaning wafers 8. This apparatus locates the outlet 4 for removing the cleaning solution in the central bottom portion of the internal cleaning tank. An external cleaning tank 2 surrounds the internal cleaning tank 1 and has inlets 3 for introducing cleaning solution into the space between the internal and external cleaning tanks. A circulation pipe 10 connects inlets 3 with outlet 4, and a circulation pump 5 is connected in the circulation pipe 10 and circulates the cleaning solution. A filter 6 filters the cleaning solution circulated by circulation pump 5. A baffle plate 9 is disposed in the lower portion of the internal cleaning tank 1 and supports a cassette 7 containing wafers 8. The baffle spaces the cassette from the bottom of the internal cleaning tank 1.

First, the cleaning solution is pumped through the filter 6 of the circulation pump 5 to fill the external cleaning tank 2 via inlets 3.

Then, cassette 7, containing wafers 8, is placed on the baffle plate 9 of internal cleaning tank 1. Wafers 8 are then cleaned by the circulating cleaning solution flowing downward through the internal cleaning tank.

The cleaning solution filtered by filter 6 is recirculated back to internal cleaning tank 1 in which wafers 8 are positioned.

The aforementioned conventional cleaning apparatuses, however, are prone to certain problems.

For example, in the over-flowing bath system having an inlet in the lower portion of an internal cleaning tank, the cleaning solution flows upwardly, and fine particles may be dislodged from the wafers by the upward flowing cleaning solution. Several of the particles, however, are of such a size that the force of gravity and the force of the flowing solution cancel each other out, causing the particle to remain in the region where the wafers are positioned. These particles may be dislodged from one portion of a wafer only to stick to another portion of the wafer or they may contaminate other wafers.

In the down-flowing bath system, the upper portion of internal cleaning tank is open so that the cleaning solution flows downwardly. Thus, fine particles, which may have been dislodged during the initial installation of the cassette or during the cleaning process, may float to the top only to be reattached to the wafers as the cassette is lifted out of the solution. Dislodged particles may also stick to other portions of the wafers or contaminate other wafers during their movement between the respective wafers toward the lower outlet.

Therefore, in the conventional cleaning apparatus, the subsequent processes do not consistently and completely clean the wafers, which lowers the yield and adversely affects their characteristics.

SUMMARY OF THE INVENTION

To solve the problems of the conventional semiconductor wafer cleaning apparatus, it is an object of the present invention to provide a semiconductor wafer cleaning apparatus which can enhance the cleaning effect of efficiently removing contaminants generated during the cleaning process by adopting a mixed method of both over-flowing method and under-flowing method.

To accomplish these and other objects, there is provided a semiconductor wafer cleaning apparatus comprising an internal cleaning tank having an inlet and an outlet in the bottom center of the internal cleaning tank for introducing and removing a cleaning solution; an external cleaning tank surrounding the internal cleaning tank to form a space therebetween and having a plurality of inlets and outlets for introducing and removing the cleaning solution by inversion, the inlets and outlets being located in the lower portion of the space between the internal and external cleaning tanks; a first circulation pipe for connecting the inlet of the internal cleaning tank with the plurality of outlets of the external cleaning tank; a second circulation pipe for connecting the outlet of the internal tank with the inlets of the external tank; first and second circulation pumps, connected in the first and second circulation pipes, respectively, for circulating the cleaning solution for recirculating the cleaning solution between the internal and external tanks in either of opposite flow directions; a baffle plate disposed within the internal cleaning tank for supporting a cassette having a plurality of wafer supports contained therein in spaced relation to the bottom of the internal cleaning tank; a weight detector operatively connected to the baffle plate for detecting the weight of the cassette; and a controller means for controlling the first and second circulation pumps to produce recirculation flow of the cleaning solution in either one of the opposite flow directions in response to a detection signal from the weight detecting means.

BRIEF DESCRIPTION OF THE DRAWINGS

The above objects and advantages of the present invention will become more apparent by describing in detail a preferred embodiment thereof with reference to the attached drawings in which:

FIG. 2 is a schematic diagram illustrating a semiconductor wafer cleaning apparatus according to the present invention.

DETAILED DESCRIPTION OF THE INVENTION

Figure 1A:
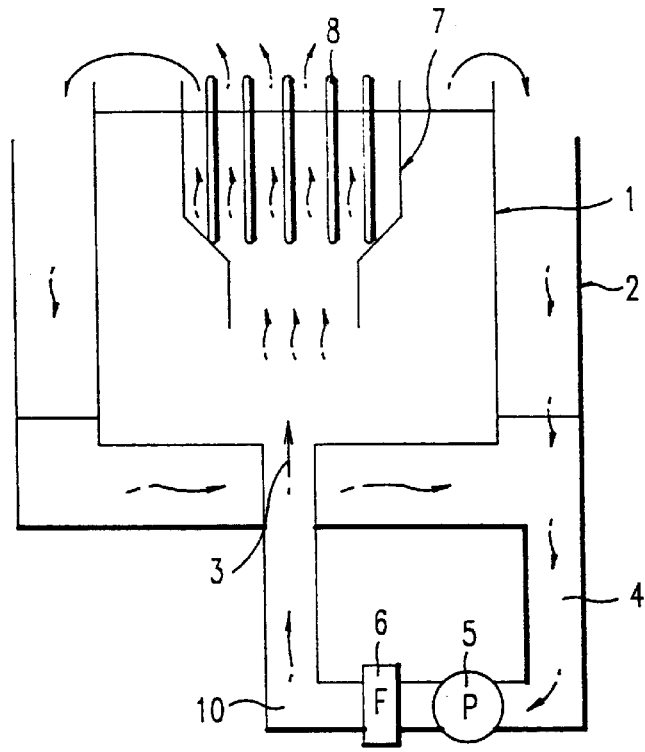
FIGS. 1a and 1b are schematic diagrams illustrating a conventional semiconductor wafer cleaning apparatus.
Figure 1B:
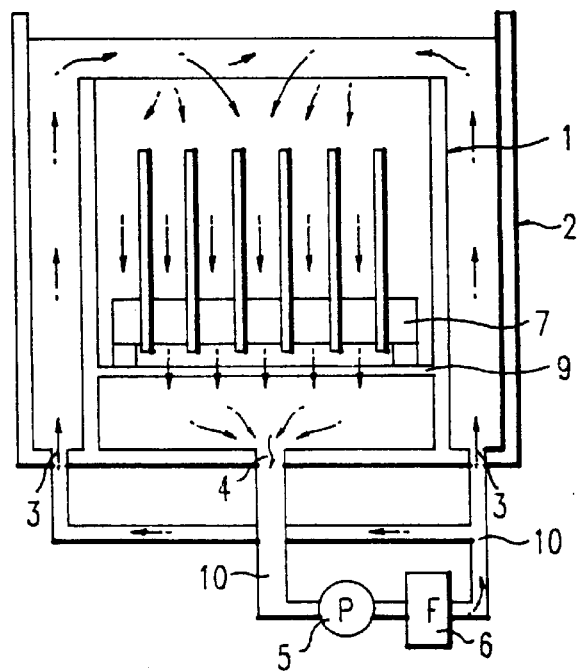

The semiconductor wafer cleaning apparatus according to the present invention includes an internal cleaning tank 23 having an inlet 31b for introducing a cleaning solution and outlet 32a for removing the cleaning solution, both located in the lower, central portion of internal tank 23. An external cleaning tank 24 surrounds the internal cleaning tank 23 and has outlets 32b for removing the cleaning solution and inlets 31a for introducing the cleaning solution to the exterior tank.

A first circulation pipe 30a connects outlets 32b to inlet 31b, and a second circulation pipe 30b connects outlet 32a to inlets 31a. A first circulation pump 28a is included in the first circulation pipe 30a to circulate the cleaning solution. A first filter 29a is also provided for filtering the cleaning solution circulating in the direction of outlets 32b to inlet 31b. A second circulation pump 28b, included in the second circulation pipe 30b, circulates the cleaning solution, and a second filter 29b is also provided for filtering the cleaning solution circulating in the direction of outlet 32a to inlets 31b. A baffle plate 26, disposed in internal cleaning tank 23, supports a cassette 22 containing a plurality of wafers 21 in spaced relation to the bottom of internal cleaning tank 23. A cassette detector 25 is located at the portion of baffle plate 26 where cassette 22 is supported to detect the presence or absence of cassette 22. A controller 27 selectively energizes first and second circulation pumps 28a and 28b in accordance with a detection signal from the detector 25. Preferably, a weight detector is used to determine the presence of the cassette on baffle plate 26.

Check valves 33 are also included to permit the cleaning solution to flow in only one direction through circulation pipes 30a and 30b. These valves are disposed in inlets 31a and 31b and outlets 32a and 32b, as shown The operation of the semiconductor wafer cleaning apparatus according to the present invention having the aforementioned configuration will now be described.

First, cassette 22, containing wafers 21, is placed in a loading position on baffle plate 26 detectable by detector 25.

Then, the presence of cassette 22 is detected by detector 25. If a weight detector is used, the weight of cassette 22 alone is suitable as the weight reference set in weight detector 25. Since the number of wafers 21 installed in cassette 22 is variable, the weight of wafers 21 should not be the weight reference.

Controller 27 controls the cleaning apparatus to operate as a down-flowing bath system in accordance with the detection signal.

In other words, the cleaning solution introduced by the second circulation pipe 30b into external tank 24, flows upwardly, overflows the common wall separating the internal and external tanks, and flows downwardly through internal cleaning tank 23.

The cleaning solution is filtered using second filter 29b. Thereafter, the cleaning solution is reintroduced into external cleaning tank 24 via inlets 31a for recirculation.

The cleaning solution, used for the cleaning process, is removed through outlet 32a to then be repeatedly circulated, or may be disposed of through valve V in a drain line connected into the lower section of circulation pipe 30a when the solution has been used a set length of time or number of times or is otherwise determined to be ready for disposal.

In this manner, the cleaning process is performed for a set cleaning period. When the cleaning of wafers 21 is completed, cassette 22 is unloaded from the loading position by a transfer mechanism.

When the cleaning process is complete, the cassette is removed and a signal is sent from the detector to the controller. The controller then shuts down pump 28b and activates pump 28a to reverse the flow of cleaning solution. The apparatus then operates as an over-flowing bath system. If a weight detector is used, and cassette 22 is unloaded, weight detector 25 detects that the weight is reduced to a set weight reference or below. In response, controller 27 controls the cleaning apparatus to operate as an over-flowing bath system.

In other words, the cleaning solution is introduced into internal cleaning tank 23 using first circulation pipe 30a.

The over-flowing cleaning solution removes any floating debris from the surface of the internal tank in the region above the wafers. The cleaning solution is removed through the outlets 32b in the lower portion of external tank 24 and is filtered using first filter 29a. Thereafter, the cleaning solution flows into internal cleaning tank 23 via inlet 31b.

The over-flowing operation continues during the removal of the cleaned wafers and continues until the next set of wafers 21, held in a cassette, is positioned in the internal cleaning tank.

In the preferred embodiment, while a specific weight (the weight of cassette 22 in the embodiment of the present invention) is not detected by weight detector 25, the cleaning apparatus performs the over-flowing operation. However, if a weight is detected by weight detector 25, the cleaning apparatus performs the down-flowing operation for a time set by the user.

Figure 3:
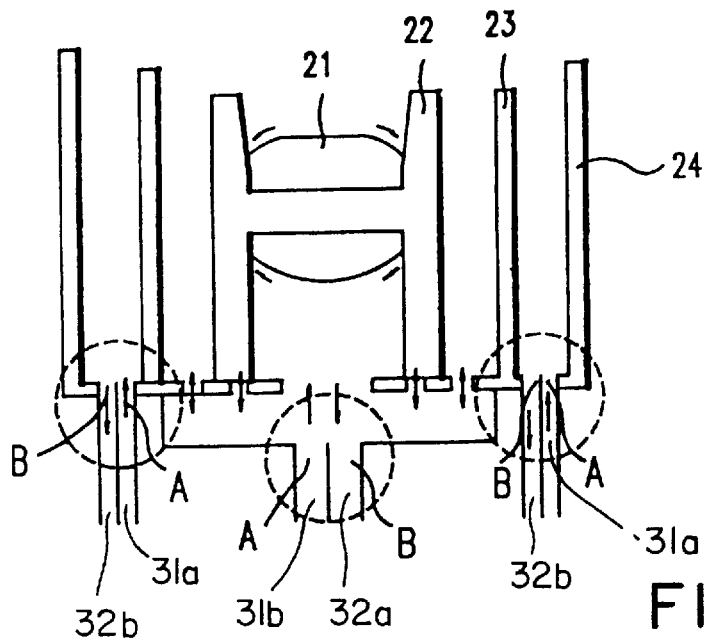
FIG. 3 is cross-sectional view illustrating a semiconductor wafer cleaning apparatus according to the present invention.
Figure 3A:
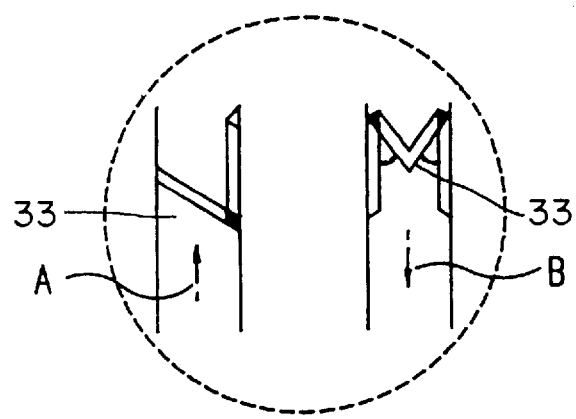
FIG. 3A is an enlarged cross-sectional view illustrating the check valves of FIG. 3.

At the time of change between the down-flowing operation and over-flowing operation, check valves (or other closures) 33 (A and B in FIG. 3) disposed in the inlets 31a and 31b and outlets 32a and 32b shut or open so that the cleaning solution can flow in one direction only.

The preferred weight detector 25 may operate by using a gas pressure detection method or an on/off switching method. The detection is made due to the weight of the cassette in both of these methods.

The aforementioned semiconductor wafer cleaning apparatus according to the present invention, in which the down-flowing operation and the over-flowing operation are selectively performed, has many advantages.

First, in the wafer cleaning operation, the cleaning apparatus operates by the down-flowing method so that any dislodged contamination CES can be more effectively removed.

Second, the fine particles (containing floating particles) dislodged during the introduction of the wafers, which tend to float on the surface of the cleaning solution in the internal tank, can be removed by using the over-flowing operation to carry them away from the cleaned wafers.

Third, the cleaning process is more efficiently performed by an automatically switched cleaning method, such as by using a weight detector.

Fourth, contaminates can be prevented from being relayed between circulation pipes owing to check valves disposed in the inlets and outlets of the respective circulation pipes.

What is claimed is:

1. A semiconductor wafer cleaning apparatus comprising:
   an internal cleaning tank having an inlet for introducing a cleaning solution and an outlet for removing the cleaning solution;
   an external cleaning tank surrounding said internal cleaning tank and having at least one inlet for introducing a cleaning solution and at least one outlet for removing the cleaning solution;
   a first circulation pipe connecting said inlet of said internal cleaning tank with said at least one outlet of said external cleaning tank;
   a second circulation pipe connecting said at least one inlet of said external tank with said outlet of said internal tank;
   first and second circulation pumps each disposed in said first and second circulation pipes for repeatedly circulating the cleaning solution;
   a cassette detector disposed in said internal tank for detecting the presence or absence of a cassette; and
   a controller for controlling said first and second circulation pumps in accordance with a detection signal of said cassette detector.

2. The semiconductor wafer cleaning apparatus of claim 1, wherein said first and second circulation pipes include first and second filters for filtering the cleaning solution.

3. The semiconductor wafer cleaning apparatus of claim 1, wherein said first and second circulation pipes include first and second valves for removing the cleaning solution from said first and second pipes.

4. The semiconductor wafer cleaning apparatus of claim 1, wherein said controller activates said first pump in response to the detector when said detector detects the absence of a cassette.

5. The semiconductor wafer cleaning apparatus of claim 4, wherein closures are provided in the outlet and inlet of said second circulation pipe for preventing flow in said second pipe when the first pump is activated.

6. The semiconductor wafer cleaning apparatus of claim 1, wherein said controller activates said second pump in response to the detector when said detector detects the presence of a cassette.

7. The semiconductor wafer cleaning apparatus of claim 6, wherein closures are provided in the outlet and inlet of said first circulation pipe for preventing flow in said first pipe when the second pump is activated.

8. The semiconductor wafer cleaning apparatus of claim 1, wherein the inlets and outlets connected to said first and second circulation pipes further include check valves for ensuring that the cleaning solution flows in only one direction in said pipes.

9. The semiconductor wafer cleaning apparatus of claim 8, wherein the check valves prevent flow in said first pipe when the second pump is activated.

10. The semiconductor wafer cleaning apparatus of claim 6, wherein the check valves prevent flow in the second pipe when the first pump is activated.

11. The semiconductor wafer cleaning apparatus of claim 1, wherein said controller drives said first circulation pump to perform an over-flowing cleaning method if the absence of a cassette is detected by said detector.

12. The semiconductor wafer cleaning apparatus of claim 1, wherein said controller drives said second circulation pump to perform a down-flowing method if the presence a cassette is detected by said detector.

13. The semiconductor wafer cleaning apparatus of claim 1, wherein said detector is a weight detector.

14. The semiconductor wafer cleaning apparatus of claim 13, wherein said weight detector is a gas pressure detector for detecting the change of the gas pressure due to the pressing of said cassette.

15. The semiconductor wafer cleaning apparatus of claim 13, wherein said weight detector is a contact switch turned on and off due to the pressing of said cassette.

16. A semiconductor wafer cleaning apparatus, comprising:
   a first tank adapted to receive a cassette containing wafers to be cleaned;
   a second tank having an outer wall and an inner wall, said inner wall of said second tank serving as a wall of said first tank;
   a pump system for supplying a cleaning solution for cleaning said wafers; and
   a controller for controlling said pumping system, whereby when said wafer cassette is provided in a stationary position in said first tank, said cleaning solution is pumped by said pumping system to said second tank to thereby supply said cleaning solution to said first tank by overflowing said cleaning solution into said first tank such that said cleaning solution flows through said first tank in a downward motion and is drained through an outlet in a bottom portion of said first tank, and
   during removal of said wafer cassette from said first tank, said pumping system is operated to direct said cleaning solution in an upward motion through said first tank.

17. A semiconductor wafer cleaning apparatus, comprising:
   an internal tank adapted to receive a cassette containing wafers to be cleaned;
   an external tank having an outer wall and an inner wall, said inner wall of said external tank serving as a wall of said internal tank;
   a pumping system for supplying a cleaning solution for cleaning said wafers; and
   a controller for controlling said pumping system such that, when said wafer cassette is placed in said internal tank, said cleaning solution is pumped into said external tank to overflow from said external tank into said internal tank and flow downward past the wafer cassette and out of said internal tank in a first circulating flow path, and
   when said wafer cassette is removed from said internal tank, said cleaning solution is pumped into said internal tank to overflow into said external tank and out of said external tank in a second circulating path.

18. A wafer cleaning apparatus, comprising:

an outer container;

an inner container;

a detector located to detect placement and removal of a wafer cassette in said inner container for wafer cleaning, wherein a first fluid circuit is established upon detection of wafer cassette placement in said inner container for flowing cleaning solution in a recirculating path downwardly through said inner container and upwardly through said outer container; and upon detection of wafer cassette removal from said inner container, a second fluid circuit is established for flowing cleaning solution in a recirculating path upwardly through said inner container and downwardly through said outer container.

19. A wafer cleaning apparatus comprising:

a container having an inner wall and an outer wall, a first bottom portion provided between said inner and outer walls and a second bottom portion provided within said inner wall, said container being adapted for receiving a cassette containing wafers to be placed on said second bottom portion; and a weight detector provided at said second bottom portion, said weight detector generating a first signal when said cassette is placed on said second bottom portion and a second signal when said cassette is removed from said second bottom portion; and a fluid circuit, conditioned in response to said first signal, to flow a cleaning solution for cleaning said wafers through an inlet in said first bottom portion, such that said cleaning solution flows over said inner wall and downwardly over said wafers to an outlet in said second bottom portion, and the fluid circuit, further conditioned in response to said second signal, to flow said cleaning solution through an inlet in said second bottom portion, such that said cleaning solution flows upward within said inner wall and over said inner wall to an outlet in said first bottom portion.

20. A wafer cleaning apparatus comprising:

an inner tank having a wall and a bottom portion on which a cassette containing wafers may be placed, said inner tank having a first inlet and first outlet;

an outer tank having an outer wall and an inner wall common with said inner tank wall, said outer tank having a second inlet and a second outlet;

a weight sensor provided at said bottom portion of said inner tank;

a controller connected to receive a first signal from said weight sensor when said cassette is placed on said bottom portion of said inner tank and to receive a second signal from said weight sensor when said cassette is removed from said inner tank;

a first pump coupled in fluid circuit between said second inlet of said outer tank and said first outlet of said inner tank, said first pump pumping a cleaning solution into said second inlet of said outer tank, such that said cleaning solution flows over said inner wall, downward over said wafers and out said first outlet of said outer tank, when activated by said controller in response to said first signal; and a second pump coupled in fluid circuit between an first inlet to said inner tank and said second outlet of said outer tank, said first pump pumping said cleaning solution into said first inlet of said inner tank, such that said cleaning solution flows upward through said inner tank, over said inner wall and out said second outlet of said outer tank, when activated by said controller in response to said second signal.

21. A wafer cleaning apparatus in accordance with claim 20, wherein a first filter is provided between said first pump and said second inlet, and a second filter is provided between said second pump and said first inlet.

22. A wafer cleaning apparatus in accordance with claim 20, further comprising:

a first fluid line connecting an output of said first pump to said second inlet of said outer tank;

a second fluid line connecting an input of said first pump to said outlet of said inner tank;

a third fluid line connecting an output of said second pump to said inlet of said inner tank;

a fourth fluid line connecting an input of said second pump to said outlet of said outer tank; and first, second, third and fourth check valves are respectively provided within said first, second, third and fourth fluid lines.

23. An apparatus for cleaning wafers in a cassette, comprising:

a tank;

detecting means for detecting a presence of said cassette in a stationary position in said tank, said detecting means generating a first signal when said cassette is in said stationary position and generating a second signal upon removal of said cassette from said stationary position;

means for supplying a downward flow of a cleaning fluid through said tank and over said wafers in response to said first signal; and means for supplying an upward flow of said cleaning fluid through said tank and over said wafers in response to said second signal.

* * * * *

UNITED STATES PATENT AND TRADEMARK OFFICE
CERTIFICATE OF CORRECTION

PATENT NO. : 5,842,491
DATED : December 1, 1998
INVENTOR(S) : Han et al.

It is certified that error appears in the above-identified patent and that said Letters Patent is hereby corrected as shown below:

Claim 10, col. 6, lines 9-10, "claim 6" should read --claim 8--.
Claim 12, col. 6, line 17, after "presence", insert --of--.
Claim 20, col. 8, line 12, "an first" should read --a first--.

Signed and Sealed this

Twenty-first Day of December, 1999

Attest:

Q. TODD DICKINSON

Attesting Officer

Acting Commissioner of Patents and Trademarks